US011901481B2

(12) United States Patent
Lopez et al.

(10) Patent No.: US 11,901,481 B2
(45) Date of Patent: Feb. 13, 2024

(54) REDUCTION OF DEFECTIVE PIXEL APPEARANCE IN LIGHT-EMITTING ARRAYS

(71) Applicant: LUMILEDS LLC, San Jose, CA (US)

(72) Inventors: Toni Lopez, Vaals (NL); Hossein Lotfi, Folsom, CA (US); Isaac Wildeson, San Jose, CA (US); Oleg Shchekin, San Francisco, CA (US)

(73) Assignee: Lumileds LLC, San Jose, CA (US)

( * ) Notice: Subject to any disclaimer, the term of this patent is extended or adjusted under 35 U.S.C. 154(b) by 171 days.

(21) Appl. No.: 17/539,941

(22) Filed: Dec. 1, 2021

(65) Prior Publication Data

US 2022/0181515 A1 Jun. 9, 2022

Related U.S. Application Data

(60) Provisional application No. 63/121,465, filed on Dec. 4, 2020.

(51) Int. Cl.
*H01L 33/02* (2010.01)
*H01L 33/08* (2010.01)
*H01L 33/50* (2010.01)

(52) U.S. Cl.
CPC ............ *H01L 33/025* (2013.01); *H01L 33/08* (2013.01); *H01L 33/504* (2013.01)

(58) Field of Classification Search
CPC ...... H01L 33/025; H01L 33/08; H01L 33/504
See application file for complete search history.

(56) References Cited

U.S. PATENT DOCUMENTS

| 7,102,673 | B2 | 9/2006 | Kimura | |
|---|---|---|---|---|
| 9,942,495 | B2 | 4/2018 | Lukac et al. | |
| 2018/0084614 | A1* | 3/2018 | Bower | H05K 3/225 |
| 2019/0195456 | A1 | 6/2019 | Pfeffer et al. | |
| 2021/0194590 | A1* | 6/2021 | Schwarz | H05B 47/185 |
| 2022/0102583 | A1* | 3/2022 | Baumheinrich | H01L 27/156 |

(Continued)

FOREIGN PATENT DOCUMENTS

| EP | 1739955 A1 | 1/2007 |
|---|---|---|
| JP | 2018197781 A | 12/2018 |

(Continued)

OTHER PUBLICATIONS

From the Korean Intellectual Property Office as the ISA, "Notification of Transmittal of the International Search Report and the Written Opinion of the International Searching Authority, or the Declaration", PCT/US2021/061580, dated Mar. 31, 2022, 10 pages.

*Primary Examiner* — Mark W Tornow

(57) ABSTRACT

An inventive light-emitting apparatus comprises an array of multiple light-emitting pixels, and one or more transmissive optical elements positioned at a light-emitting surface of the light-emitting pixel array. One or more of the light-emitting pixels is defective. Each optical element is positioned at a location of a corresponding defective light-emitting pixel, and extends over that defective pixel and laterally at least partly over one or more adjacent pixels. Each optical element transmits laterally at least a portion of light emitted by the adjacent pixels to propagate away from the array from the location of the defective pixel, reducing the appearance of the defective pixel.

20 Claims, 12 Drawing Sheets

(56) References Cited

U.S. PATENT DOCUMENTS

2022/0238751 A1* 7/2022 Singer ................ H01L 24/08
2023/0140197 A1* 5/2023 Chen ................. H01L 33/505
                                                    257/79

FOREIGN PATENT DOCUMENTS

| KR | 10-0947486 B1 | 3/2010 |
| KR | 10-1763436 B1 | 7/2017 |
| WO | 2020/136040 A1 | 7/2020 |

* cited by examiner

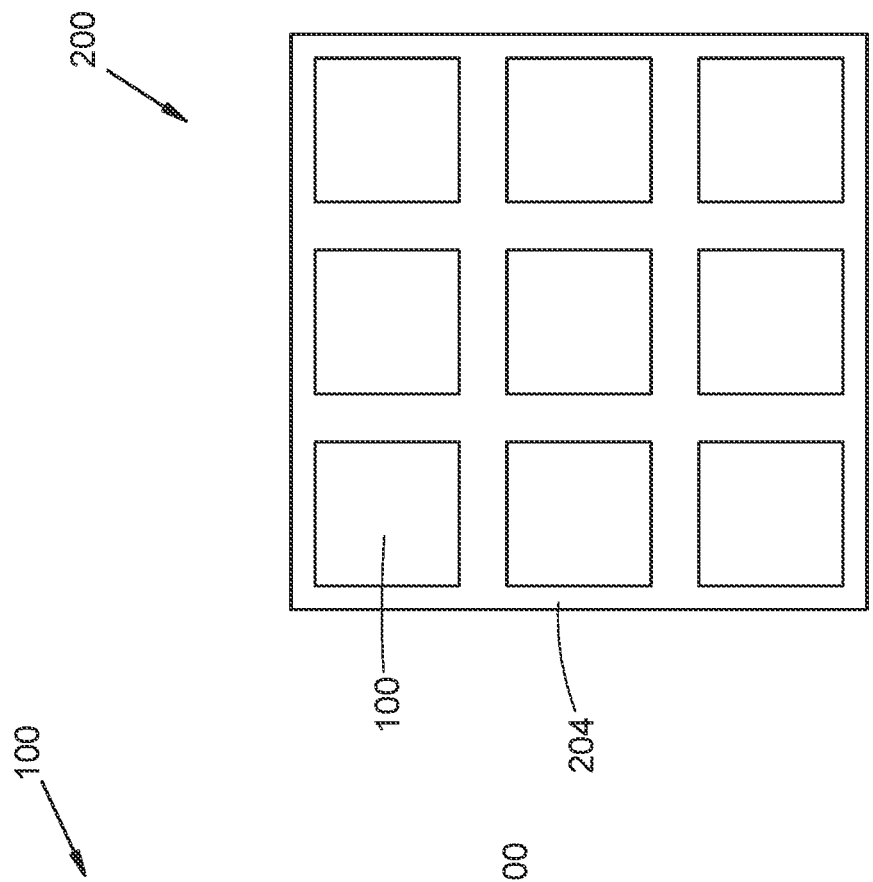
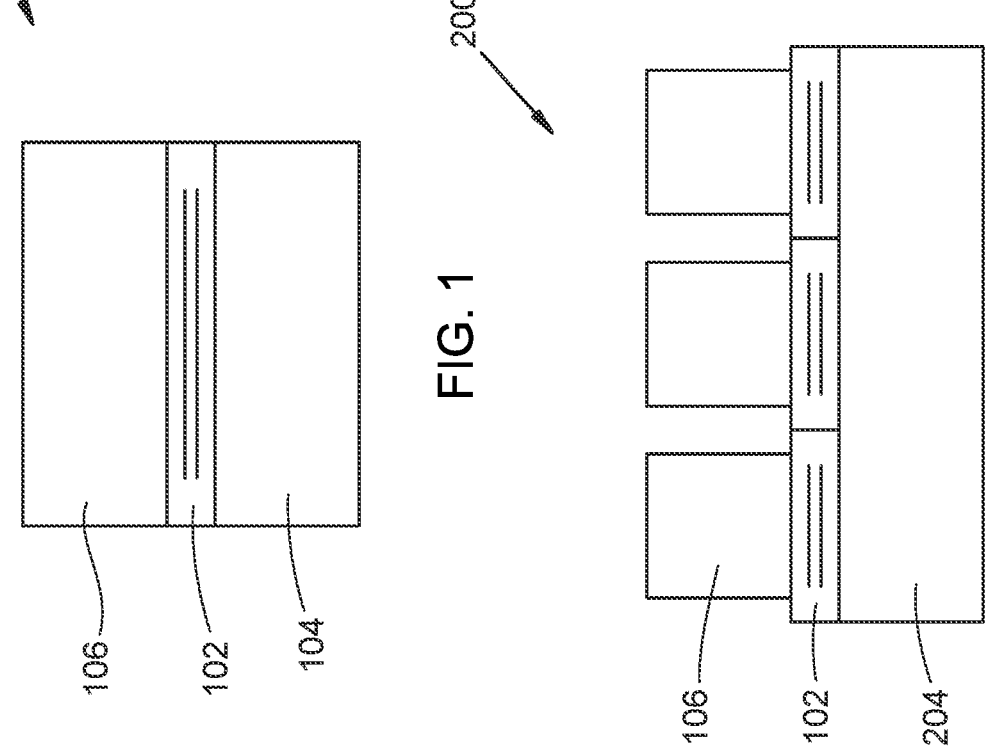
FIG. 1
FIG. 2A
FIG. 2B

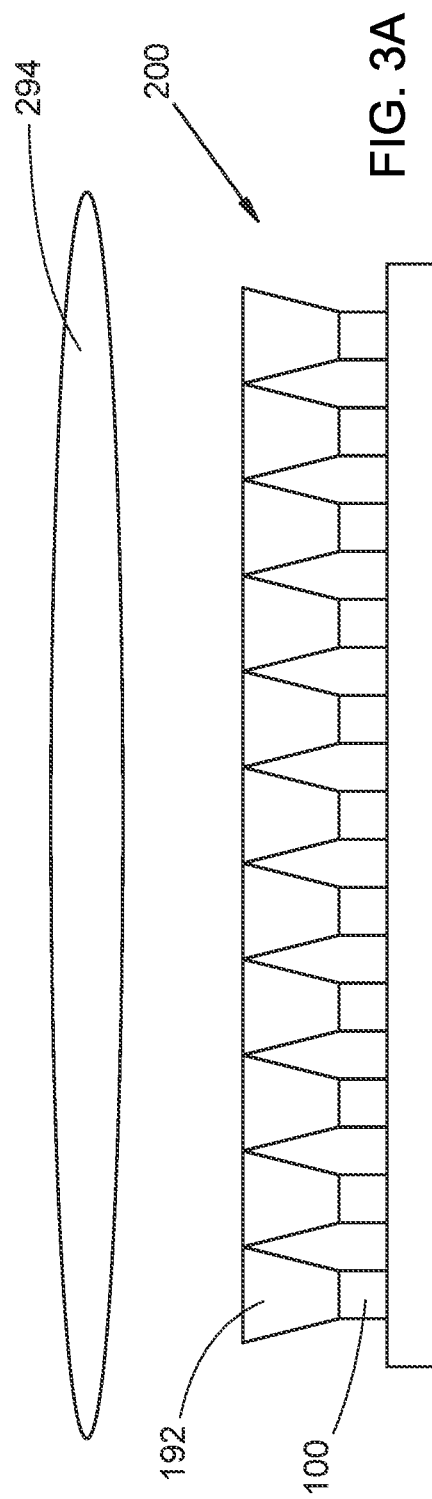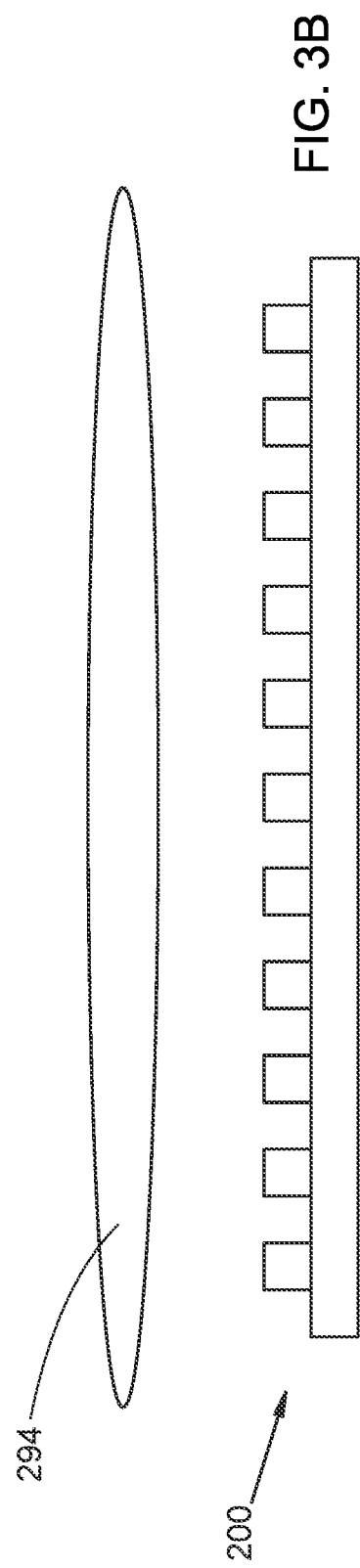

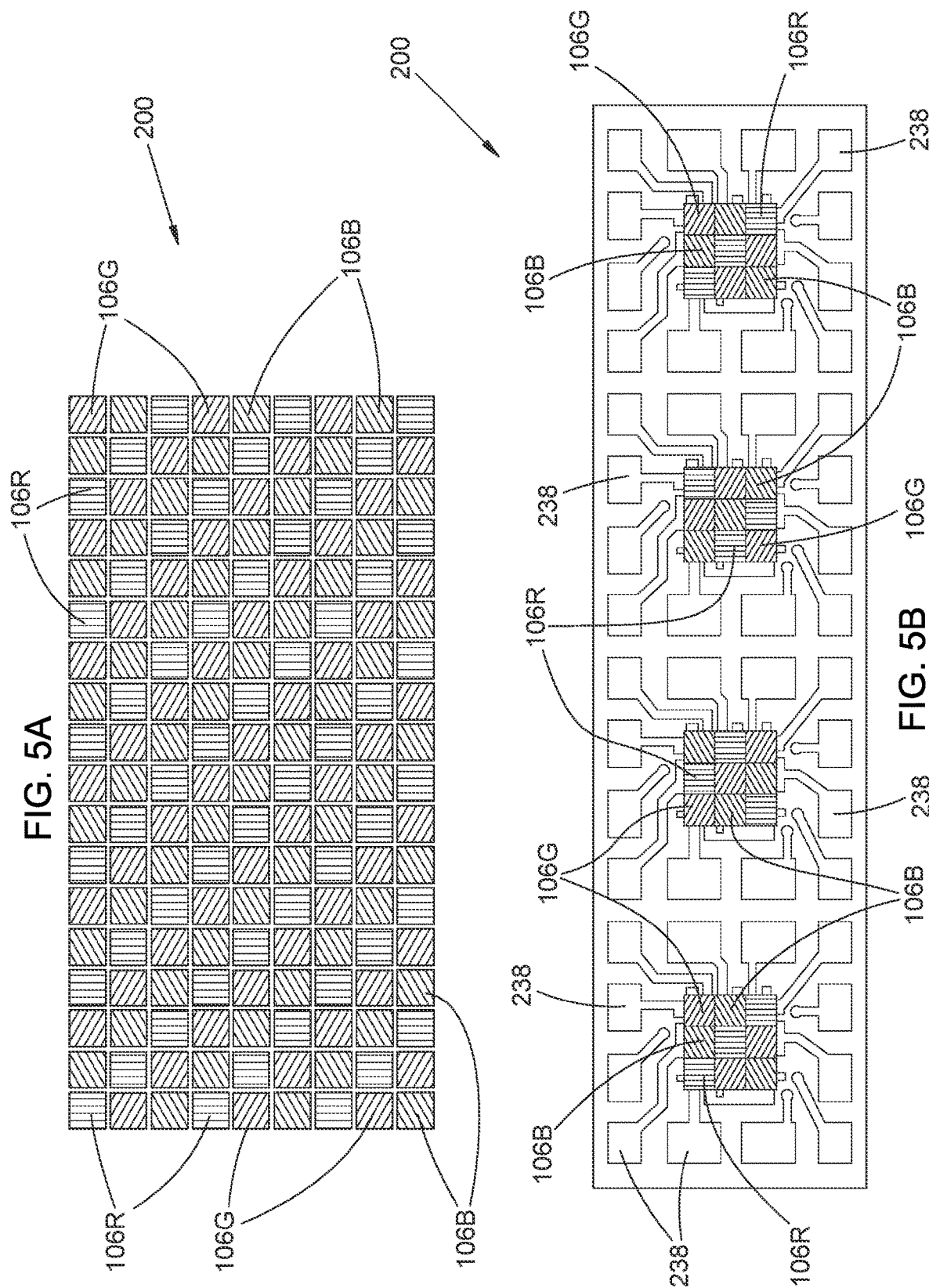

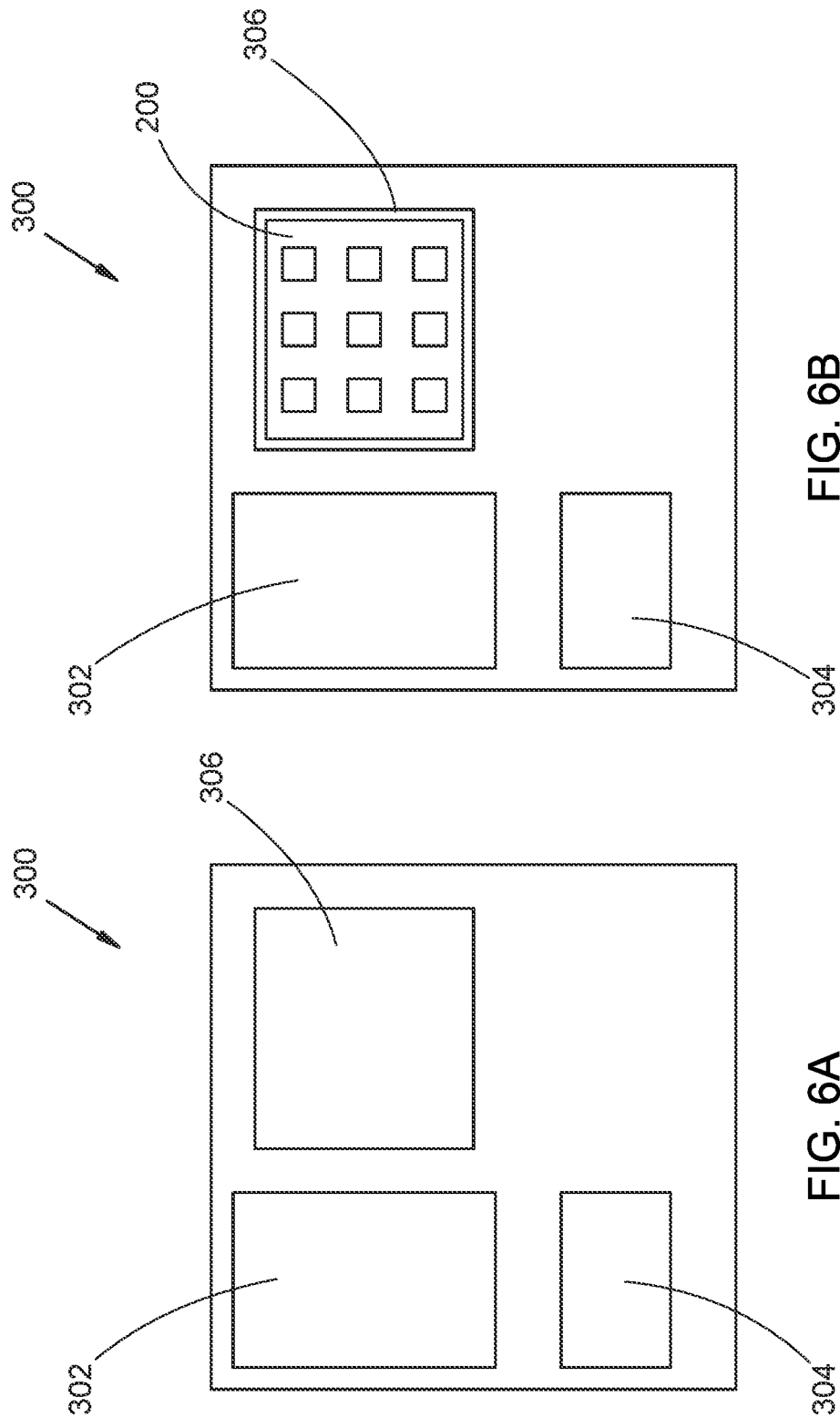

REDUCTION OF DEFECTIVE PIXEL APPEARANCE IN LIGHT-EMITTING ARRAYS

BENEFIT CLAIM

This application claims benefit of U.S. provisional App. No. 63/121,465 entitled "Method for reducing dead pixel appearance in LED matrix modules" filed Dec. 4, 2020 in the names of Lopez et al; said provisional application is incorporated herein by reference in its entirety.

FIELD OF THE INVENTION

The invention relates generally to light emitting diodes and to phosphor-converted light emitting diodes.

BACKGROUND

Semiconductor light emitting diodes and laser diodes (collectively referred to herein as "LEDs") are among the most efficient light sources currently available. The emission spectrum of an LED typically exhibits a single narrow peak at a wavelength determined by the structure of the device and by the composition of the semiconductor materials from which it is constructed. By suitable choice of device structure and material system, LEDs may be designed to operate at ultraviolet, visible, or infrared wavelengths.

LEDs may be combined with one or more wavelength converting materials (generally referred to herein as "phosphors") that absorb light emitted by the LED and in response emit light of a longer wavelength. For such phosphor-converted LEDs ("pcLEDs"), the fraction of the light emitted by the LED that is absorbed by the phosphors depends on the amount of phosphor material in the optical path of the light emitted by the LED, for example on the concentration of phosphor material in a phosphor layer disposed on or around the LED and the thickness of the layer.

Phosphor-converted LEDs may be designed so that all of the light emitted by the LED is absorbed by one or more phosphors, in which case the emission from the pcLED is entirely from the phosphors. In such cases the phosphor may be selected, for example, to emit light in a narrow spectral region that is not efficiently generated directly by an LED. Alternatively, pcLEDs may be designed so that only a portion of the light emitted by the LED is absorbed by the phosphors, in which case the emission from the pcLED is a mixture of light emitted by the LED and light emitted by the phosphors. By suitable choice of LED, phosphors, and phosphor composition, such a pcLED may be designed to emit, for example, white light having a desired color temperature and desired color-rendering properties.

Multiple LEDs or pcLEDs can be formed together on a single substrate to form an array. Such arrays can be employed to form active illuminated displays, such as those employed in, e.g., smartphones and smart watches, computer or video displays, augmented- or virtual-reality displays, or signage, or to form adaptive illumination sources, such as those employed in, e.g., automotive headlights, street lighting, camera flash sources, or flashlights (i.e., torches). An array having one or several or many individual devices per millimeter (e.g., device pitch or spacing of about a millimeter, a few hundred microns, or less than 100 microns, and separation between adjacent devices less than 100 microns or only a few tens of microns or less) typically is referred to as a miniLED array or a microLED array (alternatively, a pLED array). Such mini- or microLED arrays can in many instances also include phosphor converters as described above; such arrays can be referred to as pc-miniLED or pc-microLED arrays.

SUMMARY

An inventive light-emitting apparatus comprises an array of multiple light-emitting pixels, and one or more transmissive optical elements positioned at a light-emitting surface of the light-emitting pixel array. One or more of the light-emitting pixels is defective. Each optical element is positioned at a location of a corresponding defective light-emitting pixel, and extends over that defective pixel and laterally at least partly over one or more adjacent pixels. Each optical element transmits laterally at least a portion of light emitted by the adjacent pixels to propagate away from the array from the location of the defective pixel. The appearance of the defective pixel is thus reduced.

Objects and advantages pertaining to LEDs, pcLEDs, miniLED arrays, pc-miniLED arrays, microLED arrays, and pc-microLED arrays may become apparent upon referring to the examples illustrated in the drawings and disclosed in the following written description or appended claims.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

FIG. 1 shows a schematic cross-sectional view of an example pcLED.

FIGS. 2A and 2B show, respectively, cross-sectional and top schematic views of an example array of pcLEDs.

FIG. 3A shows a schematic cross-sectional view of an example array of pcLEDs arranged with respect to waveguides and a projection lens. FIG. 3B shows an arrangement similar to that of FIG. 3A, but without the waveguides.

FIG. 5A is a schematic top view of a portion of an example LED display in which each display pixel is a red, green, or blue phosphor-converted LED pixel. FIG. 5B is a schematic top view of a portion of an example LED display in which each display pixel includes multiple phosphor-converted LED pixels (red, green, and blue) integrated onto a single die that is bonded to a control circuit backplane.

FIG. 6A shows a schematic top view an example electronics board on which an array of pcLEDs may be mounted, and FIG. 6B similarly shows an example array of pcLEDs mounted on the electronic board of FIG. 6A.

Figure 4A:
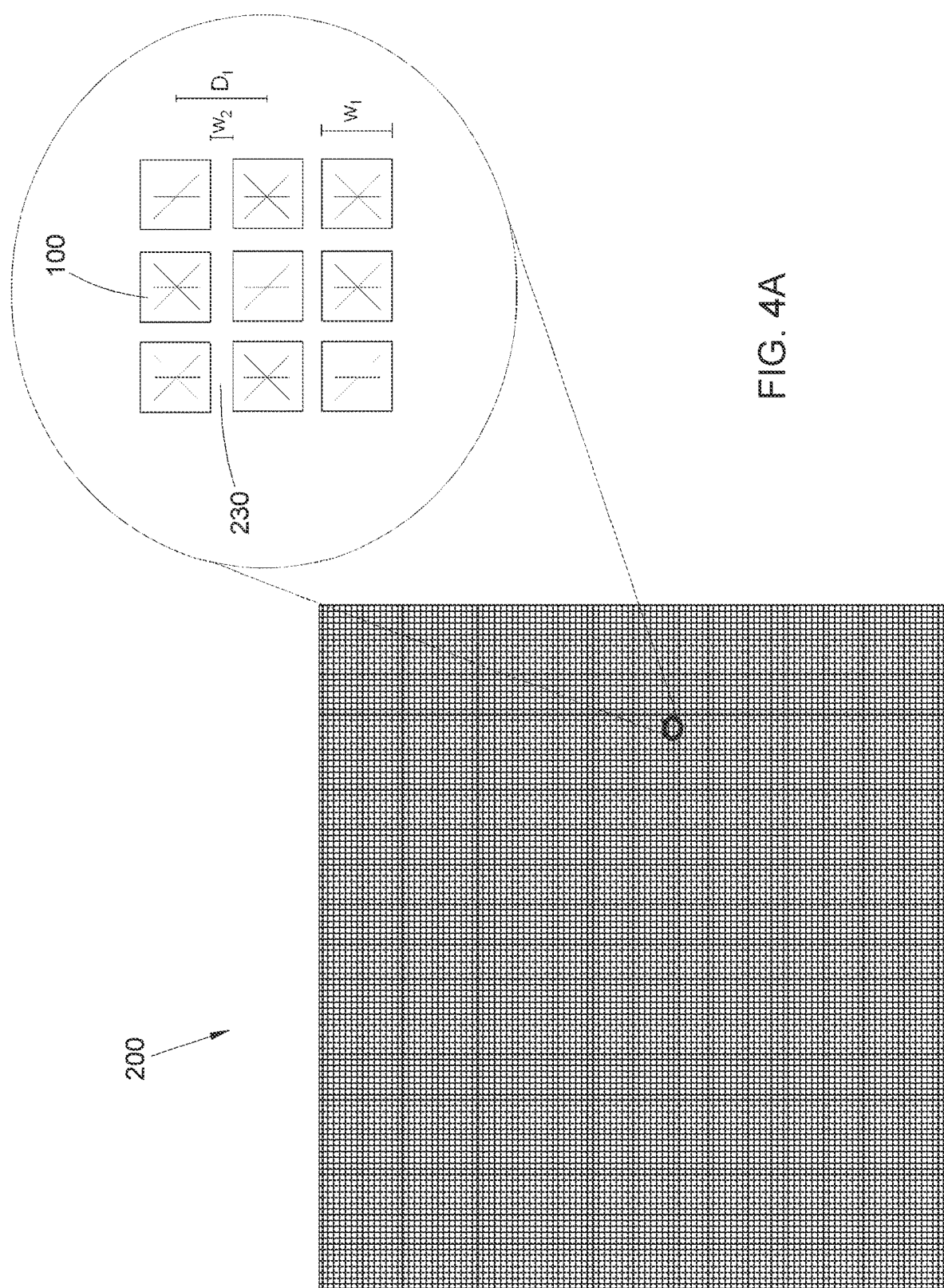
FIG. 4A shows a top schematic view of an example miniLED or microLED array and an enlarged section of 3×3 LEDs of the array.

The examples depicted are shown only schematically; all features may not be shown in full detail or in proper proportion; for clarity certain features or structures may be exaggerated or diminished relative to others or omitted entirely; the drawings should not be regarded as being to scale unless explicitly indicated as being to scale. For example, individual LEDs may be exaggerated in their vertical dimensions or layer thicknesses relative to their lateral extent or relative to substrate or phosphor thicknesses. The examples shown should not be construed as limiting the scope of the present disclosure or appended claims.

DETAILED DESCRIPTION

The following detailed description should be read with reference to the drawings, in which identical reference numbers refer to like elements throughout the different figures. The drawings, which are not necessarily to scale, depict selective examples and are not intended to limit the scope of the inventive subject matter. The detailed description illustrates by way of example, not by way of limitation, the principles of the inventive subject matter. For purposes of simplicity and clarity, detailed descriptions of well-known devices, circuits, and methods may be omitted so as not to obscure the description of the inventive subject matter with unnecessary detail.

FIG. 1 shows an example of an individual pcLED 100 comprising a semiconductor diode structure 102 disposed on a substrate 104, together considered herein an "LED" or "semiconductor LED", and a wavelength converting structure (e.g., phosphor layer) 106 disposed on the semiconductor LED. Semiconductor diode structure 102 typically comprises an active region disposed between n-type and p-type layers. Application of a suitable forward bias across the diode structure 102 results in emission of light from the active region. The wavelength of the emitted light is determined by the composition and structure of the active region.

The LED may be, for example, a III-Nitride LED that emits blue, violet, or ultraviolet light. LEDs formed from any other suitable material system and that emit any other suitable wavelength of light may also be used. Other suitable material systems may include, for example, III-Phosphide materials, III-Arsenide materials, other binary, ternary, or quaternary alloys of gallium, aluminum, indium, nitrogen, phosphorus, or arsenic, or II-VI materials.

Any suitable phosphor materials may be used for or incorporated into the wavelength converting structure 106, depending on the desired optical output from the pcLED.

FIGS. 2A-2B show, respectively, cross-sectional and top views of an array 200 of pcLEDs 100, each including a phosphor pixel 106, disposed on a substrate 204. Such an array can include any suitable number of pcLEDs arranged in any suitable manner. In the illustrated example the array is depicted as formed monolithically on a shared substrate, but alternatively an array of pcLEDs can be formed from separate individual pcLEDs (e.g., singulated devices that are assembled onto an array substrate). Individual phosphor pixels 106 are shown in the illustrated example, but alternatively a contiguous layer of phosphor material can be disposed across multiple LEDs 102. In some instances the array 200 can include light barriers (e.g., reflective, scattering, and/or absorbing) between adjacent LEDs 102, phosphor pixels 106, or both. Substrate 204 may optionally include electrical traces or interconnects, or CMOS or other circuitry for driving the LED, and may be formed from any suitable materials.

Individual pcLEDs 100 may optionally incorporate or be arranged in combination with a lens or other optical element located adjacent to or disposed on the phosphor layer. Such an optical element, not shown in the figures, may be referred to as a "primary optical element". In addition, as shown in FIGS. 3A and 3B, a pcLED array 200 (for example, mounted on an electronics board) may be arranged in combination with secondary optical elements such as waveguides, lenses, or both for use in an intended application. In FIG. 3A, light emitted by each pcLED 100 of the array 200 is collected by a corresponding waveguide 192 and directed to a projection lens 294. Projection lens 294 may be a Fresnel lens, for example. This arrangement may be suitable for use, for example, in automobile headlights or other adaptive illumination sources. Other primary or secondary optical elements of any suitable type or arrangement can be included for each pixel, as needed or desired. In FIG. 3B, light emitted by pcLEDs of the array 200 is collected directly by projection lens 294 without use of intervening waveguides. This arrangement may particularly be suitable when pcLEDs can be spaced sufficiently close to each other, and may also be used in automobile headlights as well as in camera flash applications or other illumination sources. A miniLED or microLED display application may use similar optical arrangements to those depicted in FIGS. 3A and 3B, for example. Generally, any suitable arrangement of optical elements (primary, secondary, or both) can be used in combination with the pcLEDs described herein, depending on the desired application.

Although FIGS. 2A and 2B show a 3×3 array of nine pcLEDs, such arrays may include for example on the order of $10^1$, $10^2$, $10^3$, $10^4$, or more LEDs, e.g., as illustrated schematically in FIG. 4A. Individual LEDs 100 (i.e., pixels) may have widths $w_1$ (e.g., side lengths) in the plane of the array 200, for example, less than or equal to 1 millimeter (mm), less than or equal to 500 microns, less than or equal to 100 microns, or less than or equal to 50 microns. LEDs 100 in the array 200 may be spaced apart from each other by streets, lanes, or trenches 230 having a width $w_2$ in the plane of the array 200 of, for example, hundreds of microns, less than or equal to 100 microns, less than or equal to 50 microns, less than or equal to 20 microns, less than or equal to 10 microns, or less than or equal to 5 microns. The pixel pitch or spacing Di is the sum of $w_1$ and $w_2$. Although the illustrated examples show rectangular pixels arranged in a symmetric matrix, the pixels and the array may have any suitable shape or arrangement, whether symmetric or asymmetric. Multiple separate arrays of LEDs can be combined in any suitable arrangement in any applicable format to form a larger combined array or display.

LEDs having dimensions $w_1$ in the plane of the array (e.g., side lengths) of less than or equal to about 0.10 millimeters microns are typically referred to as microLEDs, and an array of such microLEDs may be referred to as a microLED array. LEDs having dimensions $w_1$ in the plane of the array (e.g., side lengths) of between about 0.10 millimeters and about 1.0 millimeters are typically referred to as miniLEDs, and an array of such miniLEDs may be referred to as a miniLED array.

Figure 4B:
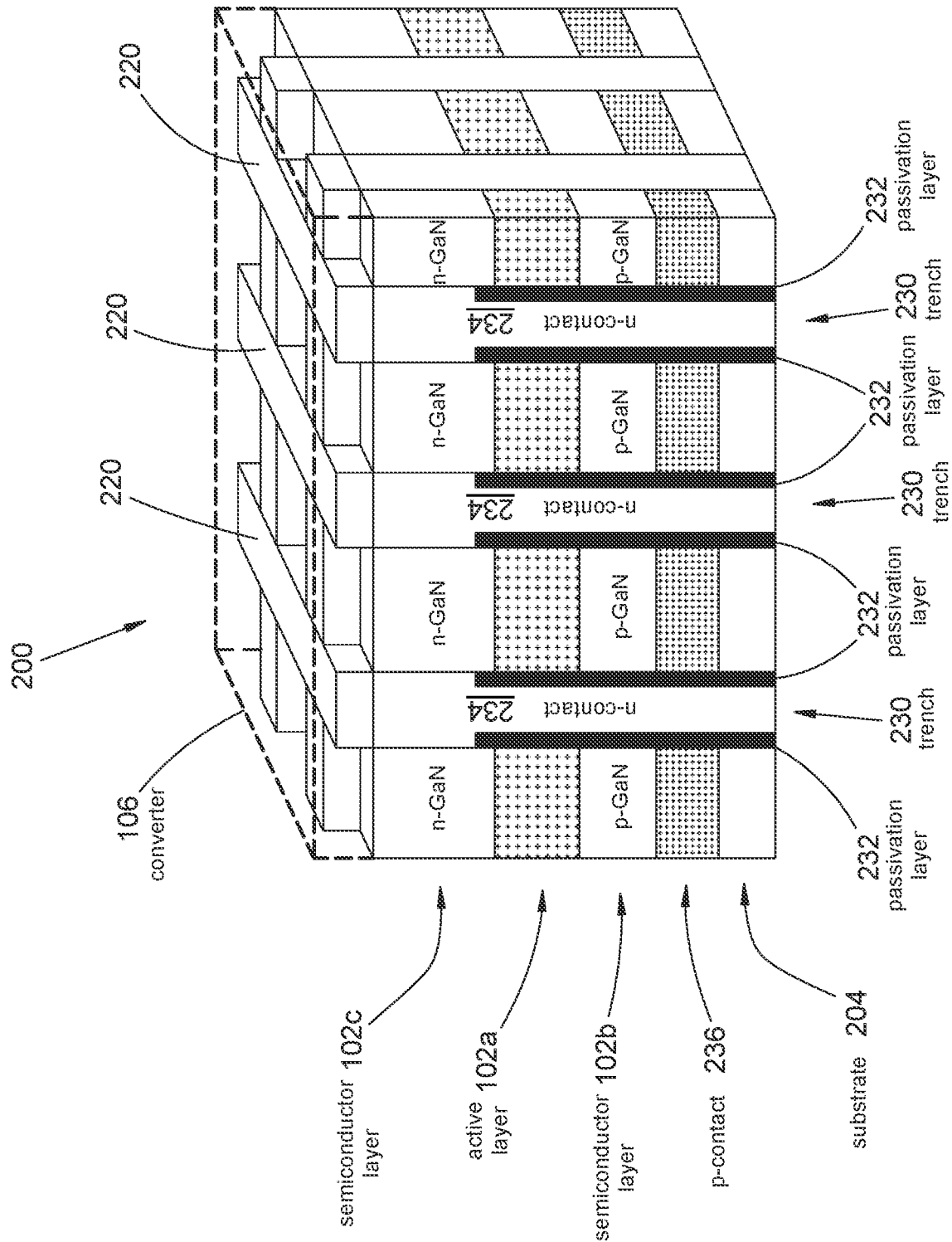
FIG. 4B shows a perspective view of several LEDs of an example pc-miniLED or pc-microLED array monolithically formed on a substrate.

An array of LEDs, miniLEDs, or microLEDs, or portions of such an array, may be formed as a segmented monolithic structure in which individual LED pixels are electrically isolated from each other by trenches and or insulating material. FIG. 4B shows a perspective view of an example of such a segmented monolithic LED array 200. Pixels in this array (i.e., individual semiconductor LED devices 102) are separated by trenches 230 which are filled to form n-contacts 234. The monolithic structure is grown or disposed on the substrate 204. Each pixel includes a p-contact 236, a p-GaN semiconductor layer 102b, an active region 102a, and an n-GaN semiconductor layer 102c; the layers 102a/102b/102c collectively form the semiconductor LED 102. A wavelength converter material 106 may be deposited on the semiconductor layer 102c (or other applicable intervening layer). Passivation layers 232 may be formed within the trenches 230 to separate at least a portion of the n-contacts 234 from one or more layers of the semiconductor. The n-contacts 234, other material within the trenches 230, or material different from material within the trenches 230 may extend into the converter material 106 to form complete or partial optical isolation barriers 220 between the pixels.

Figure 4C:
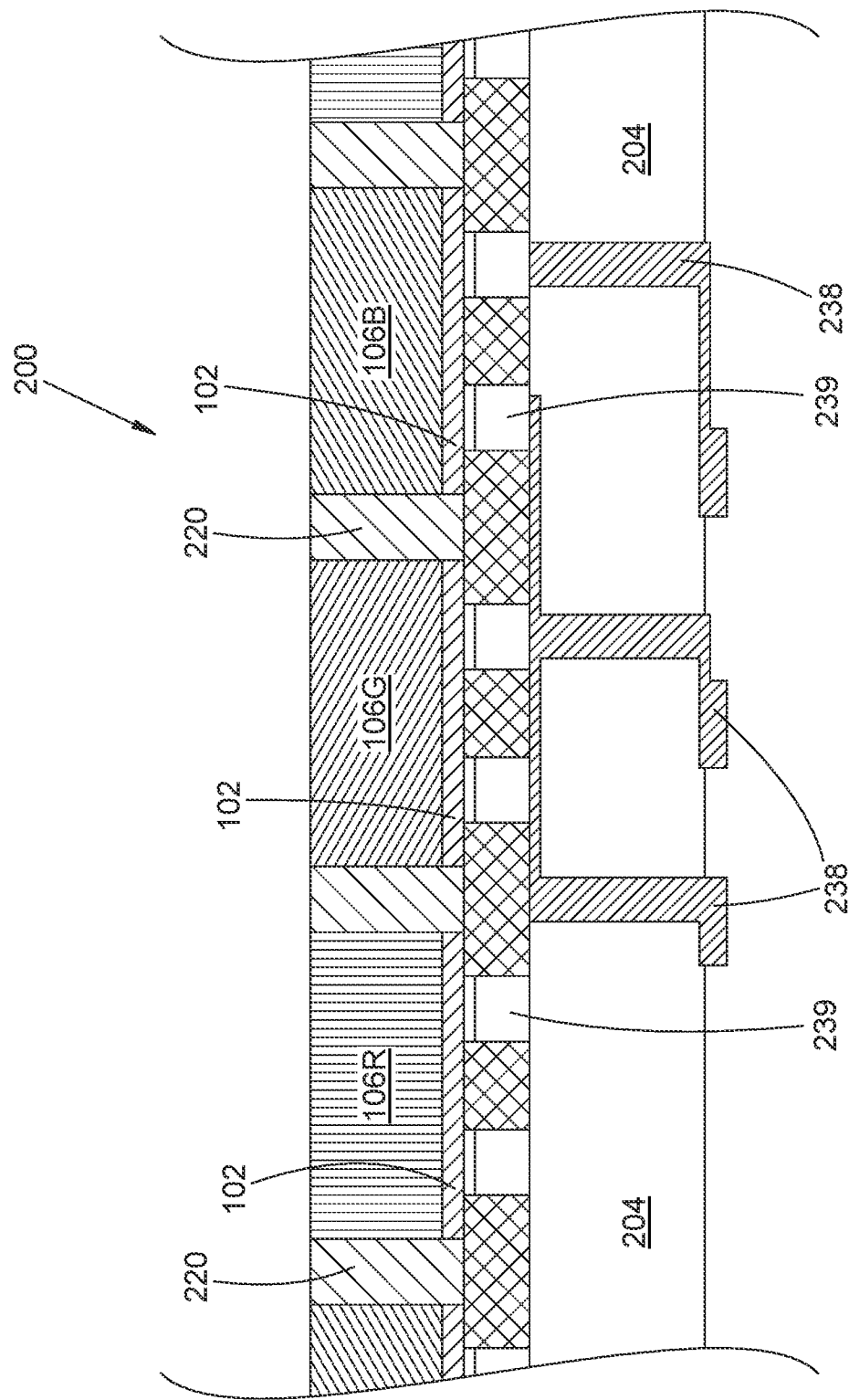
FIG. 4C is a side cross-sectional schematic diagram of an example of a close-packed array of multi-colored phosphor-converted LEDS on a monolithic die and substrate.
Figure 7:
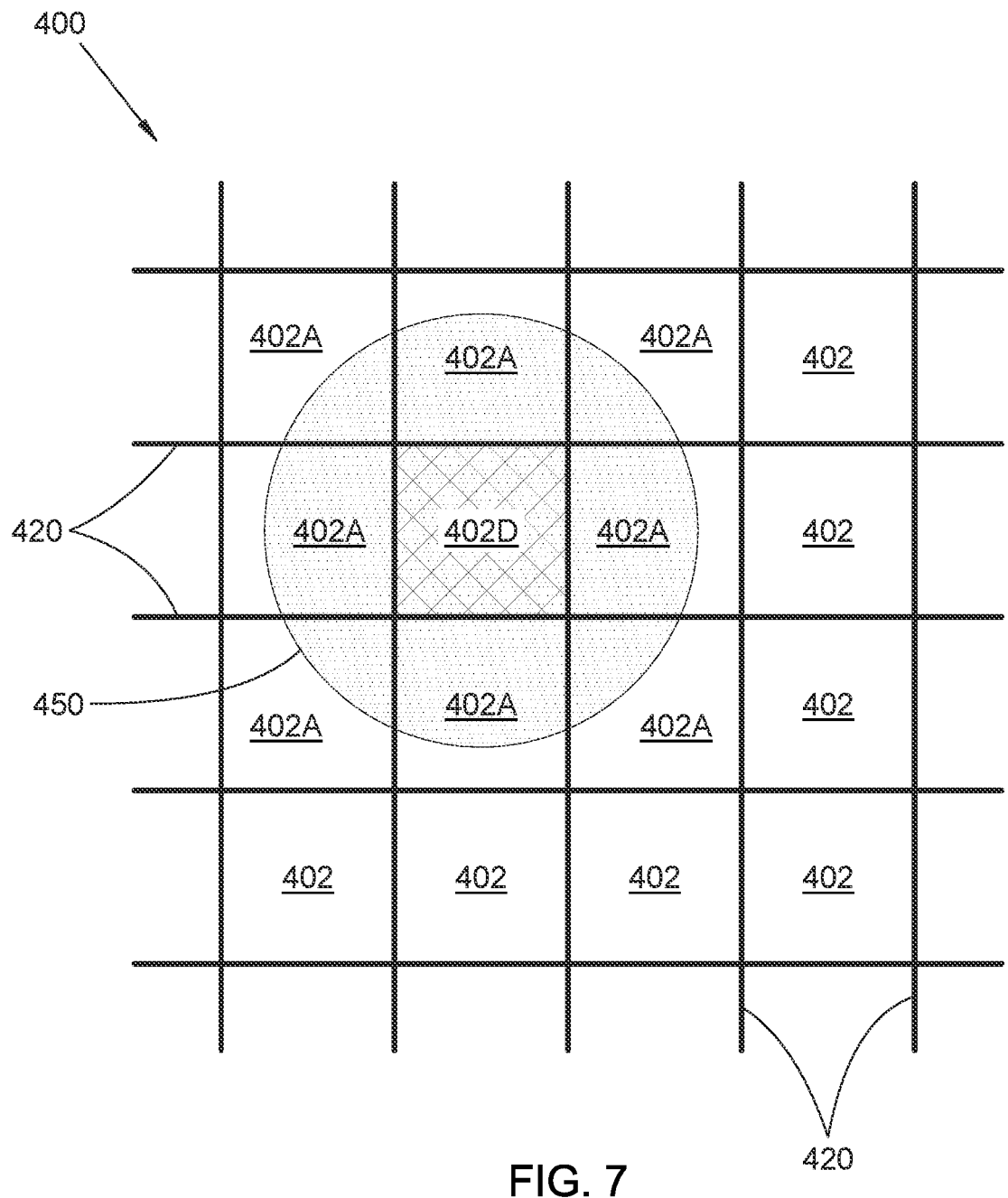
FIG. 7 is a schematic top view of an example inventive light-emitting array with a defective pixel and a transmissive optical element. Any wavelength-converting layer (if present) is omitted for clarity.

FIG. 4C is a schematic cross-sectional view of a close packed array 200 of multi-colored, phosphor converted LEDs 100 on a monolithic die and substrate 204. The side view shows GaN LEDs 102 attached to the substrate 204 through metal interconnects 239 (e.g., gold-gold interconnects or solder attached to copper micropillars) and metal interconnects 238. Phosphor pixels 106 are positioned on or over corresponding GaN LED pixels 102. The semiconductor LED pixels 102 or phosphor pixels 106 (often both) can be coated on their sides with a reflective mirror or diffusive scattering layer to form an optical isolation barrier 220. In this example each phosphor pixel 106 is one of three different colors, e.g., red phosphor pixels 106R, green phosphor pixels 106G, and blue phosphor pixels 106B (still referred to generally or collectively as phosphor pixels 106). Such an arrangement can enable use of the LED array 200 as a color display.

The individual LEDs (pixels) in an LED array may be individually addressable, may be addressable as part of a group or subset of the pixels in the array, or may not be addressable. Thus, light emitting pixel arrays are useful for any application requiring or benefiting from fine-grained intensity, spatial, and temporal control of light distribution. These applications may include, but are not limited to, precise special patterning of emitted light from pixel blocks or individual pixels, in some instances including the formation of images as a display device. Depending on the application, emitted light may be spectrally distinct, adaptive over time, and/or environmentally responsive. The light emitting pixel arrays may provide preprogrammed light distribution in various intensity, spatial, or temporal patterns. The emitted light may be based at least in part on received sensor data and may be used for optical wireless communications. Associated electronics and optics may be distinct at a pixel, pixel block, or device level.

FIGS. 5A and 5B are examples of LED arrays 200 employed in display applications, wherein an LED display includes a multitude of display pixels. In some examples (e.g., as in FIG. 5A), each display pixel comprises a single semiconductor LED pixel 102 and a corresponding phosphor pixel 106R, 106G, or 106B of a single color (red, green, or blue). Each display pixel only provides one of the three colors. In some examples (e.g., as in FIG. 5B), each display pixel includes multiple semiconductor LED pixels 102 and multiple corresponding phosphor pixels 106 of multiple colors. In the example shown each display pixel includes a 3×3 array of semiconductor pixels 102; three of those LED pixels have red phosphor pixels 106R, three have green phosphor pixels 106G, and three have blue phosphor pixels 106B. Each display pixel can therefore produce any desired color combination. In the example shown the spatial arrangement of the different colored phosphor pixels 106 differs among the display pixels; in some examples (not shown) each display pixel can have the same arrangement of the different colored phosphor pixels 106.

As shown in FIGS. 6A and 6B, a pcLED array 200 may be mounted on an electronics board 300 comprising a power and control module 302, a sensor module 304, and an LED attach region 306. Power and control module 302 may receive power and control signals from external sources and signals from sensor module 304, based on which power and control module 302 controls operation of the LEDs. Sensor module 304 may receive signals from any suitable sensors, for example from temperature or light sensors. Alternatively, pcLED array 200 may be mounted on a separate board (not shown) from the power and control module and the sensor module.

One of the challenges of using large arrays of small LED pixels is to guarantee that almost all of the pixels are properly operational and will light up to a desired or required emittance level. During fabrication, a small group of outlier pixels can be identified that do not light up sufficiently (or at all) and appear as dark or dim spots. Defective pixels are also often referred to as dead pixels. Depending on the local distribution of such defective pixels on a light-emitting array, a fraction of defective pixels even smaller than one percent of the array can in some instances prohibit its use in many applications. It is therefore desirable to develop techniques or structures that reduce such fabrication yield loss of light-emitting arrays, by reducing the appearance of defective pixels as dark or dim spots.

Accordingly, an inventive light-emitting apparatus comprises an array 400 of multiple light-emitting pixels 402, and one or more transmissive optical elements 450 positioned at a light-emitting surface of the light-emitting pixel array 400 (as in FIGS. 7, 8A, 8B, 9A, and 9B). A 4×4 segment of the array 400 is shown; the array 400 can include any suitable number or arrangement of light-emitting pixels 402, and can in some examples include light barriers 420 of any suitable type between adjacent pixels 402. One or more of the light-emitting pixels 402 can be defective, and are referred hereinafter and labelled in the drawings as defective pixel(s) 402D. Each optical element 450 is positioned at a location of a corresponding defective light-emitting pixel 402D and extends over it and laterally at least partly over one or more pixels 402 of the array 400 that are adjacent to the corresponding defective pixel 402D. Those adjacent pixels are referred to hereinafter and labelled in the drawings as adjacent pixels 402A. Note that any reference herein to "pixels 402" includes all pixels of the array 400, including defective pixels 402D and adjacent pixels 402A. Each optical element 450 laterally transmits some of the light emitted by the adjacent light-emitting pixels 402A to propagate away from the array 400 from the location of the defective pixel 402D, and so appears to have been emitted by the defective pixel 402D. The appearance of the defective pixel 402D is thereby reduced, because some of the light emitted by its neighbors 402A appears to be emitted from its location. In some examples the optical elements 450 can be transparent; in some examples the optical elements 450 act as diffuse scatterers, and can include scattering particles for that purpose (e.g., titanium oxide or other suitable material). The optical elements 450 enable a greater amount of lateral transmission of light than would otherwise occur in their absence. Scattering particles (if present) can act to reduce variations of emittance or color across the area of the defective pixel 402D.

Figure 11:
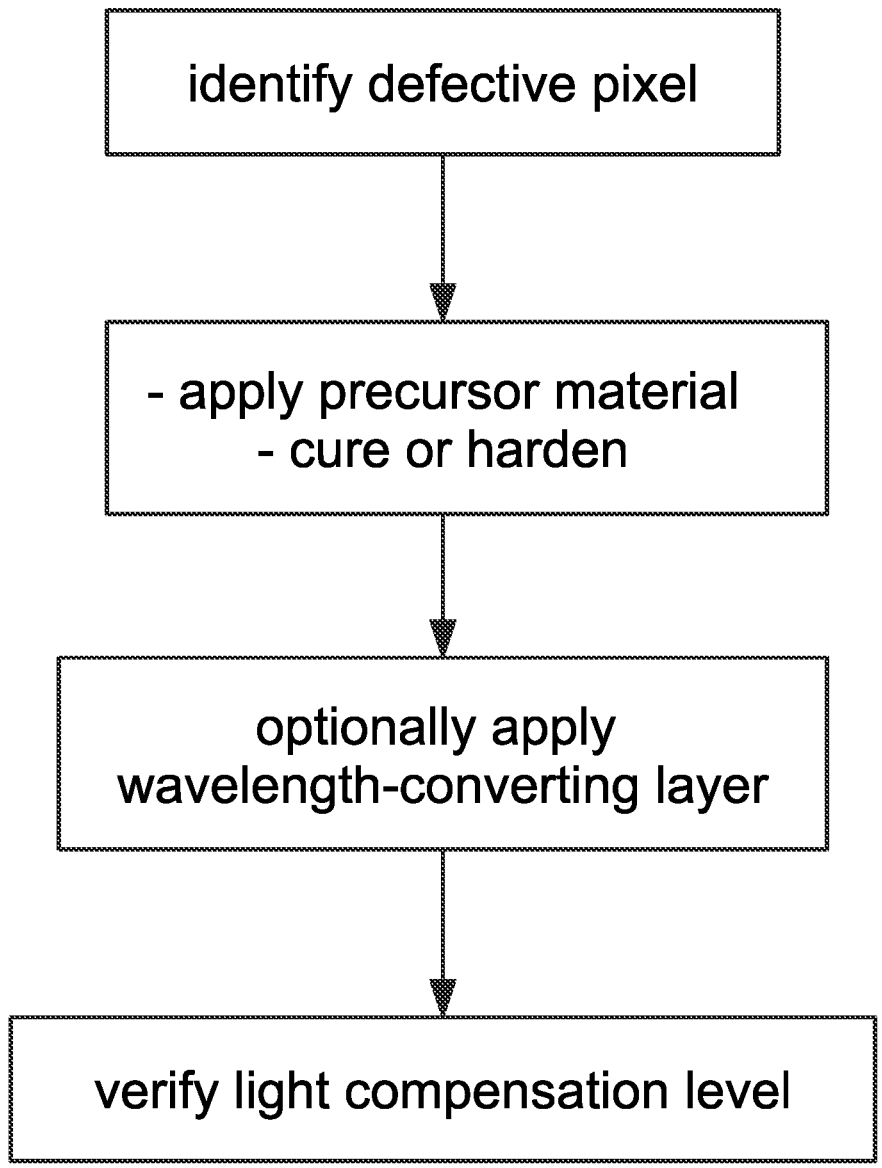
FIG. 11 illustrates an example method for making an inventive light-emitting array.

A method for making an inventive apparatus (e.g., as in FIG. 11) can begin with identifying the one or more defective pixels 402D of the array 400, e.g., using imaging or electrical testing. In some examples the pixels 402 can activated in sequence, one at a time, by groups, or according to any suitable scheme, and locations noted of defective pixels 402D that are detected. A corresponding transmissive optical element 450 can be positioned at the location of each defective pixel 402D, either by attaching a pre-formed optical element 450 or by forming the optical element 450 in situ (described further below). Each optical element 450 extends over the corresponding defective light-emitting pixel 402D and laterally at least partly over corresponding adjacent pixels 402A.

After positioning the one or more optical elements 450, in some examples the method can further include testing each defective pixel 402D against a predetermined light compensation level. In some examples a passing test can require that, with the adjacent pixels 402A activated, each defective pixel 402D exhibit emittance greater than 30%, greater than 50%, greater than 66%, or greater than 75% of emittance of the adjacent pixels 402A.

In some examples each light-emitting pixel 402 includes a corresponding semiconductor light-emitting diode (LED) and can be arranged in any suitable way, including any of the arrangements described above. In some examples the light-emitting pixels 402 can include one or more doped or undoped II-VI, or Group IV semiconductor materials or alloys or mixtures thereof; in some examples each light-emitting pixel 402 can include one or more p-n junctions, one or more quantum wells, one or more multi-quantum wells, or one or more quantum dots. In some examples the light emitted by the light-emitting pixels 402 can have a vacuum wavelength greater than 0.20 µm, greater than 0.4 µm, greater than 0.8 µm, less than 10. µm, less than 2.5 µm, or less than 1.0 µm. In some examples each light-emitting pixel 402 of the array 400 can be operable independently of at least one other light-emitting pixel 402 of the array 400; in some examples all of the light-emitting pixels 402 are operable independently of one another. In some examples spacing (i.e., pitch) of the light-emitting pixels 402 of the array 400 can be less than about 1.0 mm, less than about 0.50 mm, less than about 0.33 mm, less than about 0.20 mm, less than about 0.10 mm, less than about 0.08 mm, less than about 0.05 mm, less than about 0.033 mm, or less than about 0.020 mm. In some examples the light-emitting pixels 402 of the array 400 can be separated by non-light-emitting pixel borders having a non-zero width less than 0.10 mm, less than 0.050 mm, less than 0.033 mm less than 0.020 mm, less than 0.010 mm, or less than 0.005 mm. In some examples those borders can include light barriers 420 of any suitable type or arrangement (e.g., reflective, scattering, or absorptive).

In some examples the output of the light-emitting apparatus 400 is light emitted directly by the light-emitting pixels 402, e.g., semiconductor LEDs. In such examples, each optical element 450 can be positioned directly on corresponding light-emitting surfaces of the LEDs of the corresponding defective pixel 402D and the one or more corresponding adjacent light-emitting pixels 402A.

In some examples the light-emitting apparatus 400 can include a wavelength-converting layer 406 of any suitable type, including those described above. Light emitted by the light-emitting pixels 402 is partly or entirely absorbed by the wavelength-converting layer 406, which in turn emits light at one or more longer wavelengths. In some examples (including those shown in FIGS. 8A, 8B, 9A, and 9B), the wavelength-converting layer 406 can form a contiguous layer extending over multiple light-emitting pixels 402 of the array 400 (including over any defective pixel 402D and its adjacent pixels 402A). In some other examples the wavelength-converting layer 406 can include multiple, discrete wavelength-converting pixel elements, each positioned on or over a corresponding one of the light-emitting pixels 402 of the array 400 (including over any defective pixel 402D and its adjacent pixels 402A).

Figure 8A:
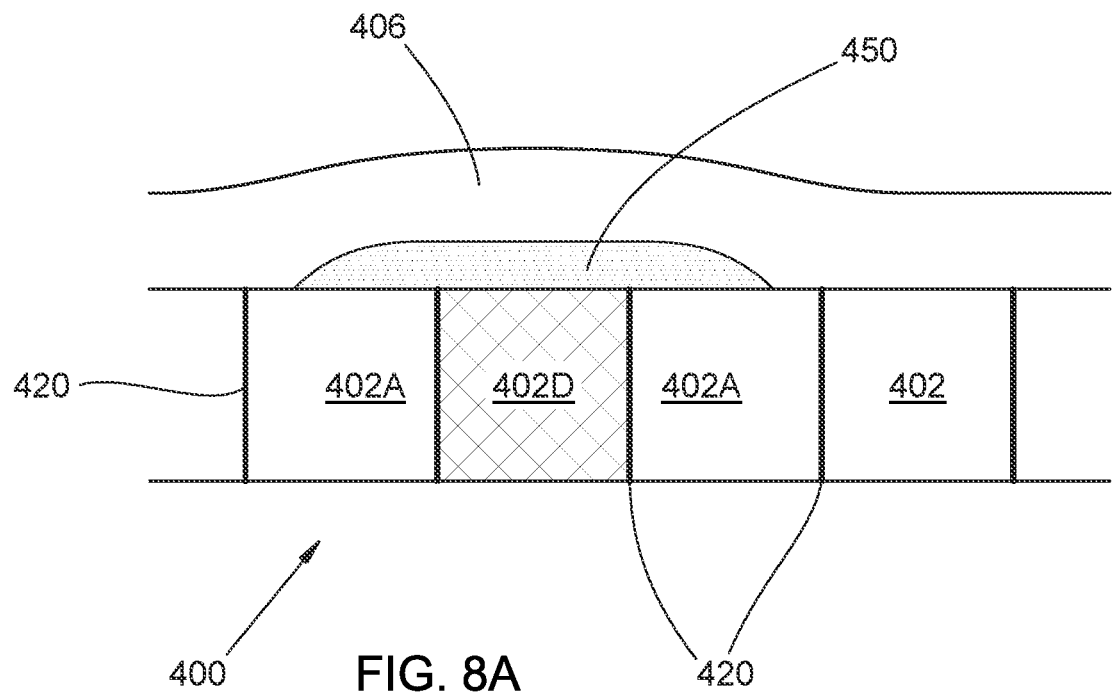
FIGS. 8A and 8B are schematic side cross-sectional views of an example inventive light-emitting array with a defective pixel and a transmissive optical element.
Figure 8B:
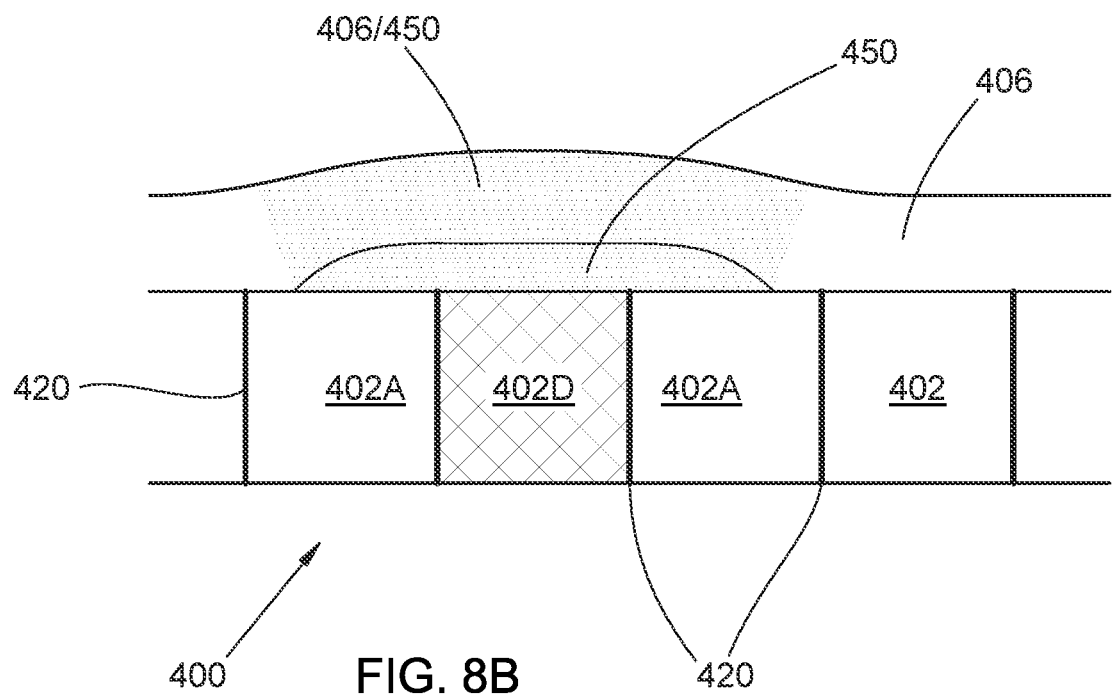

In some examples the optical elements 450 are positioned between the light-emitting pixel array 402 and the wavelength-converting layer 406 (e.g., as in the examples of FIGS. 8A and 8B). In some of those examples (e.g., as in FIG. 8A) a distinct boundary can exist between each optical element 450 and an adjacent portion of the wavelength-converting layer 406. In some other of those examples, in which the wavelength-converting layer 406 is porous, each light-emitting element 450 can include a portion infused into pores of the wavelength-converting layer 406 (e.g., as in FIG. 8B). A porous wavelength-conversion layer 406 can be formed, e.g., as an aggregate of sedimented phosphor particles, self-assembled phosphor particles, or layer-bound phosphor particles (e.g., using chemical vapor deposition or atomic layer deposition), for example. In examples that include an infused portion of the optical element 450, a portion of the optical element 450 can remain outside the porous wavelength-converting layer 406 (as in the example of FIG. 8B); in other examples the optical element can be entirely enclosed within the pores of the porous wavelength-converting layer 406. In examples having the optical elements 450 between the array 400 and the wavelength-converting layer 406, the optical elements 450 can be positioned on the array 400 before the layer 406 is attached to or formed on the array 400.

Figure 9A:
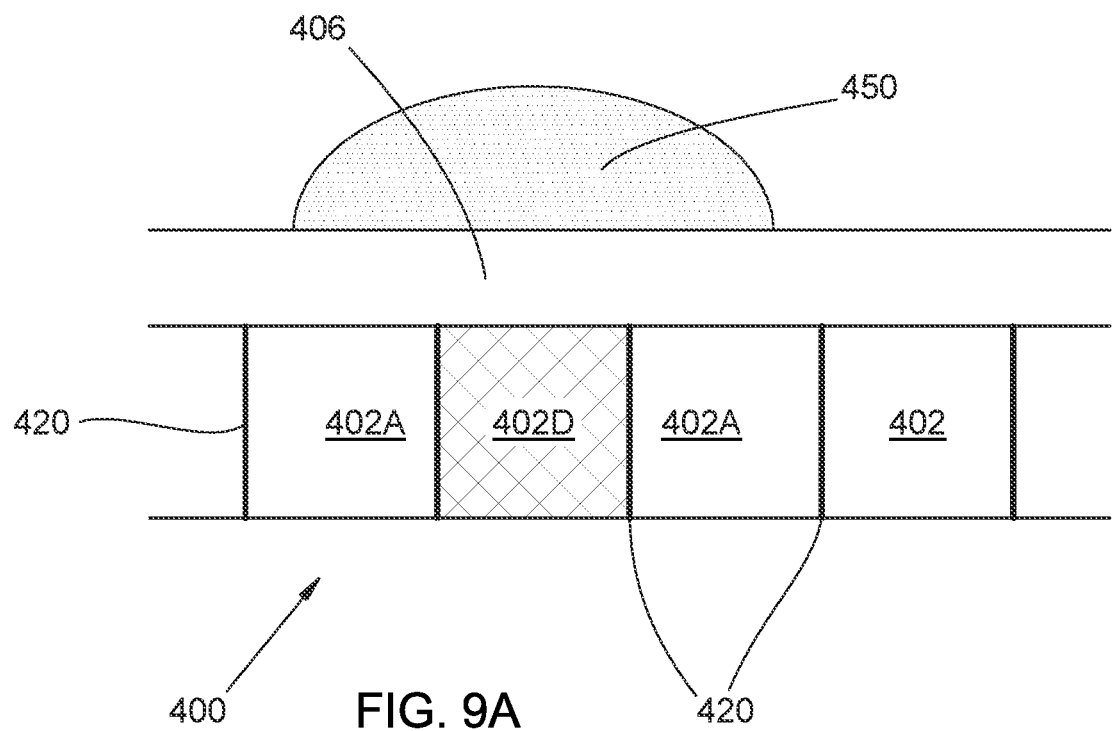
FIGS. 9A and 9B are schematic side cross-sectional views of an example inventive light-emitting array with a defective pixel and a transmissive optical element.
Figure 9B:
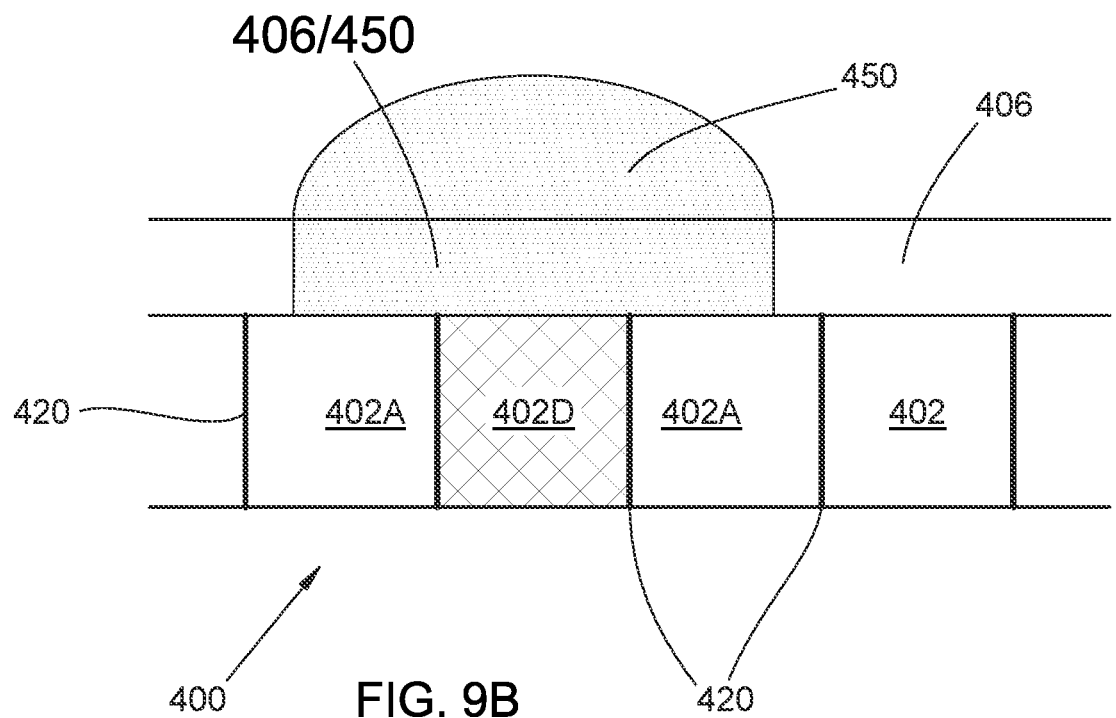

In some examples the wavelength-converting layer 406 is positioned between the light-emitting pixel array 400 and the optical elements 450 (e.g., as in the examples of FIGS. 9A and 9B). In some of those examples (e.g., as in FIG. 9A) a distinct boundary can exist between each optical element 450 and an adjacent portion of the wavelength-converting layer 406. In some other of those examples, in which the wavelength-converting layer is porous, each light-emitting element 450 can include a portion infused into pores of the wavelength-converting layer 406 (e.g., as in FIG. 9B). In examples that include an infused portion of the optical element 450, a portion of the optical element 450 can remain outside the porous wavelength-converting layer 406 (as in the example of FIG. 9B); in other examples the optical element can be entirely enclosed within the pores of the porous wavelength-converting layer 406. In examples having the wavelength-converting layer 406 between the array 400 and the optical elements 450, the optical elements 450 can be positioned on the layer 406 after the layer 406 is attached to or formed on the array 400.

In examples having all or a portion of the optical element 450 outside the wavelength-converting layer 406, transparent or translucent material of the optical element 450 enable some of the light entering from the adjacent pixels 402A to propagate laterally toward the defective pixel 402D. Multiple internal reflections or refraction, or multiple scattering events, eventually result in some of the light emitted by the adjacent pixels 402A to exit the optical element 450 and propagate away from the array 400 from the location of the defective pixel 402D, appearing to have been emitted by it. In some examples, having all or a portion of the optical element 450 infused into pores of a porous wavelength converting layer 406, the presence of the optical element 450 within the pores (instead of, e.g., air) reduces index contrast between the pore and the wavelength-converting material of the layer 406. That reduced index contrast reduces optical scattering that would have occurred within the layer 406, allowing more light emitted by the adjacent pixels 402A to reach the position of the dead pixels 402D. Some of that light leaves the wavelength-converting layer 406 from the position of the defective pixel 402D and propagates away from the array 400, appearing to have been emitted by the defective pixel 402D.

In some examples the optical elements 450 can be preformed, and positioned at the locations of defective pixels 402D, and attached to the array 400 or layer 406 in any suitable way, e.g., pick-and-place positioning, attachment using adhesive, and so on. Such procedures can result in arrangements similar to the examples of FIG. 8A or 9A.

In some other examples, the optical element 450 can be formed on the array 400 or layer 406 at the locations of defective pixels 402D. In some examples, one or more drops of liquid or semiliquid precursor can be deposited at the location of each defective pixel 402D. Examples of suitable precursors can include one or more polymer precursors (e.g., monomers, initiators, cross-linkers, and so forth), or spin-on glass precursors (e.g., a suspension of silicon oxide particles with boron, phosphorus, or other additive). In some examples the precursors can include suspended light-scattering particles of any suitable composition (e.g., titanium oxide). Curing the deposited precursor drops forms the optical elements 450 that include one or more solid polymer materials (e.g., one or more silicones) or one or more solid spin-on glass materials. If light-scattering particles were present in the precursors, then the optical elements 450 will include the light-scattering particles.

In some examples the optical elements 450 can have a rounded, convex shape, e.g., dome, hemisphere, spherical cap or segment (in some instances with rounded edges), hemispheroid, spheroidal dome or segment (in some instances with rounded edges), hemiellipsoid, ellipsoidal dome or segment (in some instances with rounded edges), droplet or meniscus, and so forth. In some examples such shapes can readily arise from deposition and curing of liquid or semiliquid precursors.

In some examples, liquid or semiliquid precursors can be deposited onto a porous wavelength-converting later 406 at the locations of defective pixels 402D. Depending on wettability of the porous layer 406 by the precursors, in some examples the precursors can infuse into pores of the layer 406. Upon curing, some or all of the resulting optical element 450 can be infused into the pores of the layer 406, resulting in arrangements such as those of FIG. 8B or 9B.

Figure 10:
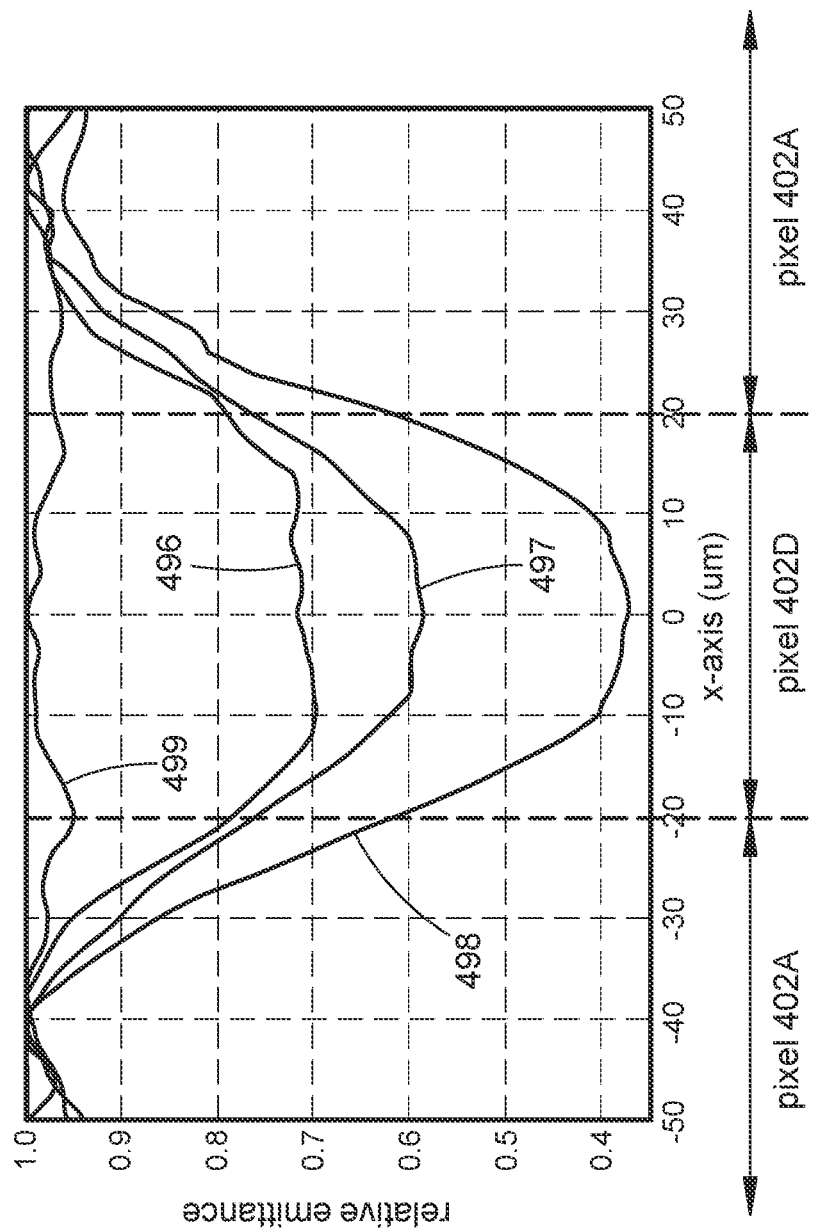
FIG. 10 is a plot of simulated near-field emittance versus lateral position for several example light-emitting arrays.

FIG. 10 shows plots of simulated relative emittance as a function of lateral position across an array of light-emitting pixels with a spacing of 40 μm. The curve 499 corresponds to all pixels 402 fully functioning; the curve 498 corresponds to a fully defective pixel 402D (no emission) without any optical elements 450; the curve 497 corresponds to a fully defective pixel 402D in an example arranged as in FIG. 8A using a spin-on glass material; the curve 496 corresponds to a fully defective pixel 402D in an example arranged as in FIG. 9B using an infused silicone droplet. Without any optical element 450 the relative apparent emittance of the defective pixel 402D is less than 40% of that of fully functional adjacent pixels 402A; the relative apparent emittance of the defective pixel 402D rises to nearly 60% with spin-on glass between the array 400 and the layer 406, and to about 70% with silicone infused into the layer 406.

In addition to the preceding, the following example embodiments fall within the scope of the present disclosure or appended claims:

Example 1. A light-emitting apparatus comprising: (a) an array of multiple light-emitting pixels, one or more of the light-emitting pixels being defective; and (b) one or more transmissive optical elements positioned at a light-emitting surface of the light-emitting pixel array, (c) each optical element being positioned at a location of a corresponding one of the one or more defective light-emitting pixels and extending over the corresponding defective light-emitting pixel and laterally at least partly over one or more light-emitting pixels of the array adjacent to the corresponding defective pixel, (d) each optical element being arranged so as to transmit laterally at least a portion of light emitted by the one or more corresponding adjacent light-emitting pixels to propagate away from the array from the location of the corresponding defective pixel.

Example 2. The apparatus of Example 1, each light-emitting pixel including a corresponding light-emitting diode (LED).

Example 3. The apparatus of any one of Examples 2 or 3, each optical element being positioned directly on corresponding light-emitting surfaces of the corresponding defective pixel and the one or more corresponding adjacent light-emitting pixels.

Example 4. The apparatus of any one of Examples 1 through 3, further comprising a wavelength-converting layer positioned at the light-emitting surface of the light-emitting pixel array with the one or more optical elements being positioned between the light-emitting pixel array and the wavelength-converting layer.

Example 5. The apparatus of any one of Examples 1 or 2, further comprising a wavelength-converting layer positioned at the light-emitting surface of the light-emitting pixel array between the one or more optical elements and the light-emitting pixel array.

Example 6. The apparatus of any one of Examples 4 or 5, the wavelength-converting layer being porous, each light-emitting element including a portion infused into pores of the wavelength-converting layer.

Example 7. The apparatus of any one of Examples 4 or 5, each optical element forming a distinct boundary with an adjacent portion of the wavelength-converting layer.

Example 8. The apparatus of any one of Examples 4 through 7, the wavelength-converting layer forming a contiguous layer extending over multiple light-emitting pixels of the array, including over each defective pixel and the corresponding adjacent pixels.

Example 9. The apparatus of any one of Examples 4 through 7, the wavelength-converting layer including multiple, discrete wavelength-converting pixel elements, each positioned on or over a corresponding one of the light-emitting pixels of the array, including over each defective pixel and the corresponding adjacent pixels.

Example 10. The apparatus of any one of Examples 1 through 9, one or more of the optical elements having a rounded, convex shape.

Example 11. The apparatus of any one of Examples 1 through 10, one or more of the optical elements including one or more spin-on glass materials.

Example 12. The apparatus of any one of Examples 1 through 11, one or more of the optical elements including one or more polymers or one or more silicones.

Example 13. The apparatus of any one of Examples 1 through 12, one or more of the optical elements including light-scattering particles.

Example 14. The apparatus of any one of Examples 1 through 13, each light-emitting pixel of the array being operable independently of at least one other light-emitting pixel of the array.

Example 15. The device of any one of Examples 1 through 14, spacing of the light-emitting pixels of the array being less than about 1.0 mm, less than about 0.50 mm, less than about 0.33 mm, less than about 0.20 mm, less than about 0.10 mm, less than about 0.08 mm, less than about 0.05 mm, less than about 0.033 mm, or less than about 0.020 mm.

Example 16. The device of any one of Examples 1 through 15, the light-emitting pixels of the array being separated by non-light-emitting pixel borders having a non-zero width less than 0.10 mm, less than 0.050 mm, less than 0.033 mm less than 0.020 mm, less than 0.010 mm, or less than 0.005 mm.

Example 17. The device of any one of Examples 1 through 16, the light-emitting pixels including one or more doped or undoped II-VI, or Group IV semiconductor materials or alloys or mixtures thereof.

Example 18. The device of any one of Examples 1 through 17, each light-emitting pixel including one or more p-n junctions, one or more quantum wells, one or more multi-quantum wells, or one or more quantum dots.

Example 19. The device of any one of Examples 1 through 18, the light emitted by the light-emitting pixels having a vacuum wavelength greater than 0.20 µm, greater than 0.4 µm, greater than 0.8 µm, less than 10. µm, less than 2.5 µm, or less than 1.0 µm.

Example 20. A method for making the apparatus of any one of Examples 1 through 19, the method comprising: (A) identifying the one or more defective pixels of the array; and (B) positioning the corresponding transmissive optical element at a location of each one of the one or more defective light-emitting pixels, each optical element extending over the corresponding defective light-emitting pixel and laterally at least partly over one or more light-emitting pixels of the array adjacent to the corresponding defective pixel.

Example 21. A method for making the apparatus of any one of Example 4 or Examples 6 through 19, the method comprising: (A) identifying the one or more defective pixels of the array; (B) positioning the corresponding transmissive optical element at a location of each one of the one or more defective light-emitting pixels, each optical element extending over the corresponding defective light-emitting pixel and laterally at least partly over one or more light-emitting pixels of the array adjacent to the corresponding defective pixel; and (C) after positioning the corresponding optical elements, forming the wavelength-converting layer with the one or more optical elements being positioned between the light-emitting pixel array and the wavelength-converting layer.

Example 22. A method for making the apparatus of any one of Examples 5 through 19, the method comprising: (A) identifying the one or more defective pixels of the array; and (B) positioning on the wavelength-converting layer the corresponding transmissive optical element at a location of each one of the one or more defective light-emitting pixels, the wavelength-converting layer being between the one or more optical elements and the light-emitting pixel array, each optical element extending over the corresponding defective light-emitting pixel and laterally at least partly over one or more light-emitting pixels of the array adjacent to the corresponding defective pixel.

Example 23. The method of Example 22 further comprising, before positioning the corresponding optical elements, forming or attaching the wavelength-converting layer at the light-emitting surface of the light-emitting pixel array.

Example 24. The method of any one of Examples 20 through 23, further comprising, after positioning the corresponding optical elements, testing each defective pixel of the array against a predetermined light compensation level.

Example 25. The method of Example 24, each defective pixel passing only if exhibiting emittance, with the corresponding adjacent pixels activated, greater than 30%, greater than 50%, greater than 66%, or greater than 75% of emittance of the corresponding adjacent pixels.

Example 26. The method of any one of Examples 20 through 25, the optical elements being formed by depositing one or more drops of liquid or semiliquid precursor at the location of each defective pixel, and curing the precursor to form the corresponding optical elements.

Example 27. The method of Example 26, the liquid precursor including one or more spin-on glass precursors or one or more polymer precursors.

Example 28. The method of any one of Examples 26 or 27, the liquid precursor including suspended light-scattering particles.

Example 29. The method of any one of Examples 26 through 28, the wavelength-converting layer being porous, the precursor being infused into pores of the wavelength-converting layer before curing.

Example 30. The method of any one of Examples 20 through 25, the optical elements being pre-formed and attached at the location of each defective pixel.

This disclosure is illustrative and not limiting. Further modifications will be apparent to one skilled in the art in light of the present disclosure and are intended to fall within the scope of the present disclosure or appended claims. It is intended that equivalents of the disclosed example embodiments and methods, or modifications thereof, shall fall within the scope of the present disclosure or appended claims.

In the foregoing Detailed Description, various features may be grouped together in several example embodiments for the purpose of streamlining the disclosure. This method of disclosure is not to be interpreted as reflecting an intention that any claimed embodiment requires more features than are expressly recited in the corresponding claim. Rather, as the appended claims reflect, inventive subject matter may lie in less than all features of a single disclosed example embodiment. Therefore, the present disclosure shall be construed as implicitly disclosing any embodiment having any suitable subset of one or more features—which features are shown, described, or claimed in the present application—including those subsets that may not be explicitly disclosed herein. A "suitable" subset of features includes only features that are neither incompatible nor mutually exclusive with respect to any other feature of that subset. Accordingly, the appended claims are hereby incorporated in their entirety into the Detailed Description, with each claim standing on its own as a separate disclosed embodiment. In addition, each of the appended dependent claims shall be interpreted, only for purposes of disclosure by said incorporation of the claims into the Detailed Description, as if written in multiple dependent form and dependent upon all preceding claims with which it is not inconsistent. It should be further noted that the cumulative scope of the appended claims can, but does not necessarily, encompass the whole of the subject matter disclosed in the present application.

The following interpretations shall apply for purposes of the present disclosure and appended claims. The words "comprising," "including," "having," and variants thereof, wherever they appear, shall be construed as open ended terminology, with the same meaning as if a phrase such as "at least" were appended after each instance thereof, unless explicitly stated otherwise. The article "a" shall be interpreted as "one or more" unless "only one," "a single," or other similar limitation is stated explicitly or is implicit in the particular context; similarly, the article "the" shall be interpreted as "one or more of the" unless "only one of the," "a single one of the," or other similar limitation is stated explicitly or is implicit in the particular context. The conjunction "or" is to be construed inclusively unless: (i) it is explicitly stated otherwise, e.g., by use of "either . . . or," "only one of," or similar language; or (ii) two or more of the listed alternatives are understood or disclosed (implicitly or explicitly) to be incompatible or mutually exclusive within the particular context. In that latter case, "or" would be understood to encompass only those combinations involving non-mutually-exclusive alternatives. In one example, each of "a dog or a cat," "one or more of a dog or a cat," and "one or more dogs or cats" would be interpreted as one or more dogs without any cats, or one or more cats without any dogs, or one or more of each. In another example, each of "a dog, a cat, or a mouse," "one or more of a dog, a cat, or a mouse," and "one or more dogs, cats, or mice" would be interpreted as (i) one or more dogs without any cats or mice, (ii) one or more cats without and dogs or mice, (iii) one or more mice without any dogs or cats, (iv) one or more dogs and one or more cats without any mice, (v) one or more dogs and one or more mice without any cats, (vi) one or more cats and one or more mice without any dogs, or (vii) one or more dogs, one or more cats, and one or more mice. In another example, each of "two or more of a dog, a cat, or a mouse" or "two or more dogs, cats, or mice" would be interpreted as (i) one or more dogs and one or more cats without any mice, (ii) one or more dogs and one or more mice without any cats, (iii) one or more cats and one or more mice without and dogs, or (iv) one or more dogs, one or more cats, and one or more mice; "three or more," "four or more," and so on would be analogously interpreted.

For purposes of the present disclosure or appended claims, when a numerical quantity is recited (with or without terms such as "about equal to," "substantially equal to," "greater than about," "less than about," and so forth), standard conventions pertaining to measurement precision and significant digits shall apply, unless a differing interpretation is explicitly set forth. For null quantities described by phrases such as "substantially prevented," "substantially absent," "substantially eliminated," "about equal to zero," "negligible," and so forth, each such phrase shall denote the case wherein the quantity in question has been reduced or diminished to such an extent that, for practical purposes in the context of the intended operation or use of the disclosed or claimed apparatus or method, the overall behavior or performance of the apparatus or method does not differ from that which would have occurred had the null quantity in fact been completely removed, exactly equal to zero, or otherwise exactly nulled.

For purposes of the present disclosure and appended claims, any labelling of elements, steps, limitations, or other portions of an embodiment, example, or claim (e.g., first, second, third, etc., (a), (b), (c), etc., or (i), (ii), (iii), etc.) is only for purposes of clarity, and shall not be construed as implying any sort of ordering or precedence of the portions so labelled. If any such ordering or precedence is intended, it will be explicitly recited in the embodiment, example, or claim or, in some instances, it will be implicit or inherent based on the specific content of the embodiment, example, or claim. In the appended claims, if the provisions of 35 USC § 112(f) are desired to be invoked in an apparatus claim, then the word "means" will appear in that apparatus claim. If those provisions are desired to be invoked in a method claim, the words "a step for" will appear in that method claim. Conversely, if the words "means" or "a step for" do not appear in a claim, then the provisions of 35 USC § 112(f) are not intended to be invoked for that claim.

If any one or more disclosures are incorporated herein by reference and such incorporated disclosures conflict in part or whole with, or differ in scope from, the present disclosure, then to the extent of conflict, broader disclosure, or broader definition of terms, the present disclosure controls. If such incorporated disclosures conflict in part or whole with one another, then to the extent of conflict, the later-dated disclosure controls.

The Abstract is provided as required as an aid to those searching for specific subject matter within the patent literature. However, the Abstract is not intended to imply that any elements, features, or limitations recited therein are necessarily encompassed by any particular claim. The scope of subject matter encompassed by each claim shall be determined by the recitation of only that claim.

What is claimed is:

1. A light-emitting device comprising:
   an array of LEDs, one or more of the LEDs being defective; and
   a set of one or more transmissive optical elements positioned at a light-emitting surface of the LED array,
   each transmissive optical element of the set being positioned at a location of a corresponding one of the one or more defective LEDs and extending over the corresponding defective LED and laterally at least partly over one or more LEDs of the array adjacent to the corresponding defective LED,
   each transmissive optical element of the set being arranged so as to transmit laterally at least a portion of light emitted by the one or more corresponding adjacent LEDs to propagate away from the array from the location of the corresponding defective LED.

2. The light-emitting device of claim 1, further comprising a wavelength-converting layer positioned at the light-emitting surface of the LED array with the one or more transmissive optical elements being positioned between the LED array and the wavelength-converting layer.

3. The light-emitting device of claim 1, further comprising a wavelength-converting layer positioned at the light-emitting surface of the LED array between the one or more transmissive optical elements and the LED array.

4. The light-emitting device of claim 1, further comprising a wavelength-converting layer positioned at the light-emitting surface of the LED array, the wavelength-converting layer being porous, each transmissive optical element including a portion infused into pores of the wavelength-converting layer.

5. The light-emitting device of claim 1, each LED of the array being operable independently of at least one other LED of the array.

6. The light-emitting device of claim 1, spacing of the LEDs of the array being less than about 0.10 mm.

7. The light-emitting device of claim 1, one or more of the transmissive optical elements having a rounded, convex shape.

8. The light-emitting device of claim 1, one or more of the transmissive optical elements including one or more spin-on glass materials, one or more polymers, or one or more silicones.

9. The light-emitting device of claim 1, one or more of the transmissive optical elements including light-scattering particles.

10. A lighting system comprising:
a light-emitting module comprising
an array of LEDs, one or more of the LEDs being defective,
a set of one or more transmissive optical elements positioned at a light-emitting surface of the LED array, each transmissive optical element of the set being positioned at a location of a corresponding one of the one or more defective LEDs and extending over the corresponding defective LED and laterally at least partly over one or more LEDs of the array adjacent to the corresponding defective LED, and
a power and control module including circuitry structured and connected so as to enable selective activation of one or more LEDs of the array or one or more groups of LEDs of the array,
each transmissive optical element of the set being arranged so as to transmit laterally at least a portion of light emitted by the one or more corresponding adjacent LEDs to propagate away from the array from the location of the corresponding defective LED; and
a set of one or more secondary optical elements arranged for projecting an image of the array of LEDs, lateral transmission of light by each transmissive element resulting in reduced or eliminated appearance of the corresponding defective LED in the image of the array.

11. The lighting system of claim 10, the array of LEDs including $10^4$ or more of the LEDs.

12. The lighting system of claim 10, spacing of the LEDs of the array being less than about 0.10 mm.

13. The lighting system of claim 10 further comprising a sensor module structured and connected so as to deliver signals to the power and control module, the power and control module being structured and connected to as to alter, in response to altered signals received from the sensor module, which one or more LEDs of the array, or one or more groups of LEDs of the array, are selectively activated.

14. The lighting system of claim 10, the light-emitting module and the set of one or more secondary optics being structured and arranged as a vehicle headlight.

15. The lighting system of claim 10 further comprising:
a second light-emitting module comprising
a second array of LEDs, one or more of the LEDs of the second array being defective,
a second set of one or more transmissive optical elements positioned at a light-emitting surface of the second LED array, each transmissive optical element of the second set being positioned at a location of a corresponding one of the one or more defective LEDs of the second array and extending over the corresponding defective LED and laterally at least partly over one or more LEDs of the second array adjacent to the corresponding defective LED, and
a second power and control module including circuitry structured and connected so as to enable selective activation of one or more LEDs of the second array or one or more groups of LEDs of the second array,
each transmissive optical element of the second set being arranged so as to transmit laterally at least a portion of light emitted by the one or more corresponding adjacent LEDs to propagate away from the second array from the location of the corresponding defective LED; and
a second set of one or more secondary optical elements arranged for projecting an image of the second array of LEDs, lateral transmission of light by each transmissive element resulting in reduced or eliminated appearance of the corresponding defective LED in the image of the second array,
the light-emitting module and the set of one or more secondary optics being structured and arranged as a first vehicle headlight, and the second light-emitting module and the second set of one or more secondary optics being structured and arranged as a second vehicle headlight.

16. A method for making a light-emitting device, the method comprising:
identifying one or more defective LEDs of an array of LEDs; and
positioning a corresponding transmissive optical element at a location of each one of the one or more identified defective LEDs, each transmissive optical element extending over the corresponding defective LED and laterally at least partly over one or more LEDs of the array adjacent to the corresponding defective LED, each transmissive optical element being arranged so as to transmit laterally at least a portion of light emitted by the one or more corresponding adjacent LEDs to propagate away from the array from the location of the corresponding defective LED.

17. The method of claim 16 further comprising forming or attaching a wavelength-converting layer positioned at the light-emitting surface of the LED array, (i) with the one or more transmissive optical elements between the LED array and the wavelength-converting layer, (ii) with the wavelength-converting layer between the LED array and the one or more transmissive optical elements, or (iii) with the one or more transmissive optical elements including corresponding portions infused into pores of the wavelength-converting layer.

18. The method of claim 16, further comprising, after positioning the corresponding transmissive optical elements, testing each defective LED of the array against a predetermined light compensation level, each defective LED passing only if exhibiting emittance, with the corresponding adjacent LEDs activated, greater than 30% of emittance of the corresponding adjacent LEDs.

19. The method of claim 16, the transmissive optical elements being formed by depositing one or more drops of liquid or semiliquid precursor at the location of each defective LED, and curing the precursor to form the corresponding transmissive optical elements.

20. The method of claim 16, the transmissive optical elements being pre-formed and attached at the location of each defective LED.

* * * * *